United States Patent
Szczyrbowski et al.

[11] Patent Number: 5,888,305
[45] Date of Patent: Mar. 30, 1999

[54] VACUUM COATING APPARATUS WITH A CRUCIBLE IN THE VACUUM CHAMBER TO HOLD MATERIAL TO BE EVAPORATED

[75] Inventors: Joachim Szczyrbowski, Goldbach; Götz Teschner, Hanau; Alfons Zöller, Bad Soden-Salmünster, all of Germany

[73] Assignee: Balzers Und Leybold Deutsch, Germany

[21] Appl. No.: 741,669

[22] Filed: Oct. 31, 1996

[30] Foreign Application Priority Data

Nov. 30, 1995 [DE] Germany ............... 195 44 584.8

[51] Int. Cl.⁶ .................................................. C23C 14/00
[52] U.S. Cl. ............................ 118/723 EB; 118/723 VE; 204/298.06; 204/298.08
[58] Field of Search ................ 118/723 EB, 723 VE; 204/298.05, 298.06, 298.08

[56] References Cited

U.S. PATENT DOCUMENTS

| | | | |
|---|---|---|---|
| 4,885,070 | 12/1989 | Campbell et al. | 204/192.11 |
| 4,956,070 | 9/1990 | Nakada | 204/298.18 |
| 5,302,208 | 4/1994 | Grimm et al. | 118/718 |
| 5,399,252 | 3/1995 | Scherer et al. | 204/298.19 |
| 5,415,757 | 5/1995 | Szczyrbowski | 204/298.08 |
| 5,597,622 | 1/1997 | Zoller et al. | 427/563 |
| 5,656,141 | 8/1997 | Betz et al. | 204/298.05 |

FOREIGN PATENT DOCUMENTS 4416525  12/1994  Germany.

*Primary Examiner*—Thi Dang
*Attorney, Agent, or Firm*—Fulbright & Jaworski, LLP

[57] ABSTRACT

A vacuum chamber contains a crucible (4) and an electron beam source (5) for evaporating material in the crucible. A substrate holder (6) holds substrates (7) above the crucible (4) with a process space therebetween. A magnetron cathode (11, 12) is located in each of two compartments (9, 10) located on either side of the process space. An aperture (21, 22) connects each compartment to the process space; each cathode (11, 12) carries a target (13, 14) facing away from the respective aperture (21, 22). The cathodes are connected to a medium frequency RF power supply (16), and process gas is supplied to the compartments by lines (17, 18).

5 Claims, 2 Drawing Sheets

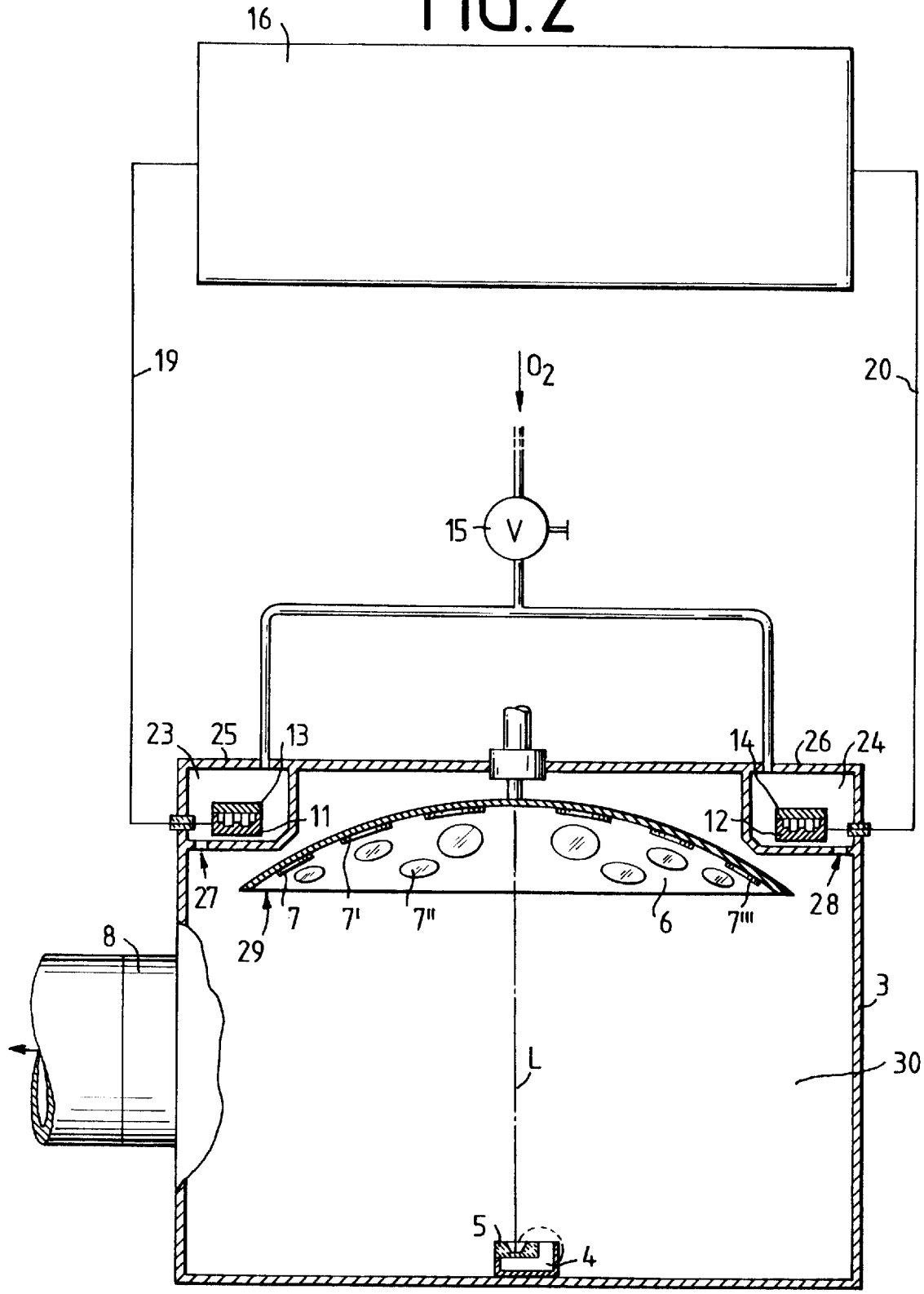

VACUUM COATING APPARATUS WITH A CRUCIBLE IN THE VACUUM CHAMBER TO HOLD MATERIAL TO BE EVAPORATED

BACKGROUND OF THE INVENTION

The invention pertains to a vacuum coating apparatus with a crucible to hold material to be evaporated, such as $SiO_2$; an electron beam source to evaporate the material, and a holder for a substrate, such as an optical lens, held a certain distance away from the crucible.

U.S. Pat. No. 5,302,308 discloses a vacuum coating apparatus with a container in which material to be evaporated is held; with an evaporation device for evaporating the material in the container, the material to be coated being a certain distance away from the material to be evaporated; and with a microwave transmitter, which transmits microwaves into the space between the material to be evaporated and the material to be coated.

This known apparatus makes it possible to improve the properties of a metal oxide coating on a plastic film.

U.S. Pat. No. 4,956,070 discloses an apparatus for depositing a thin film from the vapor phase, in which the rates at which layers of different materials are deposited can be controlled, so that extremely thin layer packages can be produced. For this purpose, at least two different types of counterelectrodes are provided on the cathode side.

DE 35 41 621 discloses an apparatus for depositing a metal alloy by means of HF sputtering, in which two targets are driven in alternation. Both targets contain the metal components of the metal alloy to be deposited but in different proportions. For the purpose of deposition, the substrates are mounted on a substrate carrier, which is rotated by a drive unit during the sputtering process.

DE 38 02 852 discloses an apparatus for coating a substrate, including two electrodes and at least one material to be sputtered, the substrate to be coated can be set up between and a certain distance away from the two electrodes, and that the alternating current half-waves can be selected as low-frequency half-waves with essentially the same amplitudes.

U.S. Pat. No. 5,415,757 discloses an apparatus for coating a substrate especially with nonconductive layers from electrically conductive targets in a reactive atmosphere, consisting of a current source, which is connected to cathodes which enclose magnets and which are installed in an evacuatable coating chamber, the cathodes working together electrically with the targets. Two anodes, which are separated electrically from each other and from the sputtering chamber, are provided; they are installed in a plane between the cathodes and the substrate. Each of the two outputs of the secondary winding of a transformer connected to a medium-frequency generator is connected to a cathode by way of a power supply line, the first and the second supply lines being connected to each other by a branch line, into which an oscillating circuit, preferably a coil and a capacitor, are inserted. Each of the two supply lines is connected both to the coating chamber by way of a first electrical element which adjusts the d.c. potential with respect to ground and also to the respective anode by way of a corresponding second electrical element as well as to the coating chamber by way of a branch line containing a capacitor. A choke coil is inserted in the segment of the first supply line which connects the oscillatory circuit to the second secondary winding.

U.S. Pat. No. 4,885,070 discloses a cathode sputtering apparatus in which the vacuum chamber is connected to a device for generating a plasma jet. The apparatus has a target, which works together with magnets, which guide the plasma jet onto the surface of the target. The apparatus is also provided with a device for accelerating ions in the plasma jet, which strike the surface of the target and break out particles from it. Substrate holders are installed inside the vacuum chamber to hold the substrates as they are being coated with the sputtered particles. The apparatus is preferably equipped with a device such as an array of magnets to divert at least one strand or partial stream of the plasma jet from the target onto the substrate.

Finally, DE 44 12 906 discloses a method for ion-assisted vacuum coating, preferably for the high-speed coating of large, electrically conductive or electrically insulating substrates with electrically insulating layers and for coating electrically insulating substrates with electrically conductive layers. In this method, a plasma is generated between a coating source and the substrate, and ions from the plasma are accelerated toward the substrate. Alternating negative and positive voltage pulses relative to the plasma are applied to the electrically conductive substrate or to an electrode mounted directly behind the electrically insulating substrate and extending over the entire surface to be coated. The duration of the negative pulses is adjusted to the charging time of the capacitor being formed over the insulating layer and/or the insulating substrate, whereas the duration of the positive pulses is at most equal to, preferably 2–10 times smaller than, the duration of the negative pulses. The positive and negative pulses succeed each other without pause and are adjusted approximately to the same amplitude relative to the base potential. The amplitude of the pulses relative to the base potential is adjusted to ±20 to ±2,000 V, preferably to ±50 to ±500 V.

Transparent plastic films are being used to an increasing extent for the packaging of food products. The films primarily in question here are made of polymeric plastics, which, although they are flexible, suffer from the disadvantage that they are permeable to aromatic substances, water, and oxygen. When it is desired to prevent the diffusion of such substances, the general practice is to use aluminum foils or plastic films onto which a layer of aluminum has been deposited from the vapor phase. These have the disadvantage, however, that they are relatively difficult to dispose of and are not transparent to microwaves or light. Because of the widespread use of microwave ovens in many households of industrialized countries, it is often important for a packaging material to be transparent to microwaves.

To combine the advantages of plastic films, which are transparent to microwaves, with the advantages of aluminum foils, which form an impenetrable barrier to aromatic substances, water, and oxygen, it is already known that polymer films can be coated with oxides. Silicon oxide plays the most important role as a coating material for this purpose. The properties of plastic films coated with silicon oxide are similar to those of aluminum foil or aluminum-coated plastic film with respect to the structure of the laminate and the barrier behavior with respect to oxygen, water vapor, and aromas.

The coating of plastic films with metal oxides such as $SiO_x$, however, requires a process technology which differs sharply from the conventional coating technologies, because metal oxides, in contrast to metals, must be evaporated from the solid phase.

$SiO_x$ layers are produced by evaporating SiO by the use of an evaporation furnace or by means of an electron beam (see T. Krug and K. Rübsam: "The new glass-like food packaging" in Neue Verpackung [New Packaging], H uthig-Verlag, 1991). $SiO_x$ layers offer the advantage that they are more flexible. In addition, $SiO_x$ is also chemically inert and corrosion-resistant with respect to water. Because it has a relatively high vapor pressure, SiO can, like MgO, $Al_2O_3$, and $SiO_2$, be evaporated by means of an electron beam.

SUMMARY OF THE INVENTION

The present invention provides a vacuum coating apparatus which makes it possible to coat films, especially packaging films, with transparent barrier layers at a high rate and with high quality. The apparatus is also intended to have a long service life in spite of the parasitic oxide layers being deposited and to make possible a high level of process stability.

According to the invention, compartments are provided on both sides of a connecting line between the crucible and the substrate. A magnetron cathode connected to a medium-frequency power source is installed in each compartment, the two compartments being connected by way of a channel to the zone between the substrate and the crucible, and by way of pressure medium lines to sources for a process gas.

BRIEF DESCRIPTION OF THE DRAWING

FIG. 2 is a schematic cross section of a second embodiment of the coating apparatus.

DETAILED DESCRIPTION OF THE PREFERRED EMBODIMENT

Figure 1:
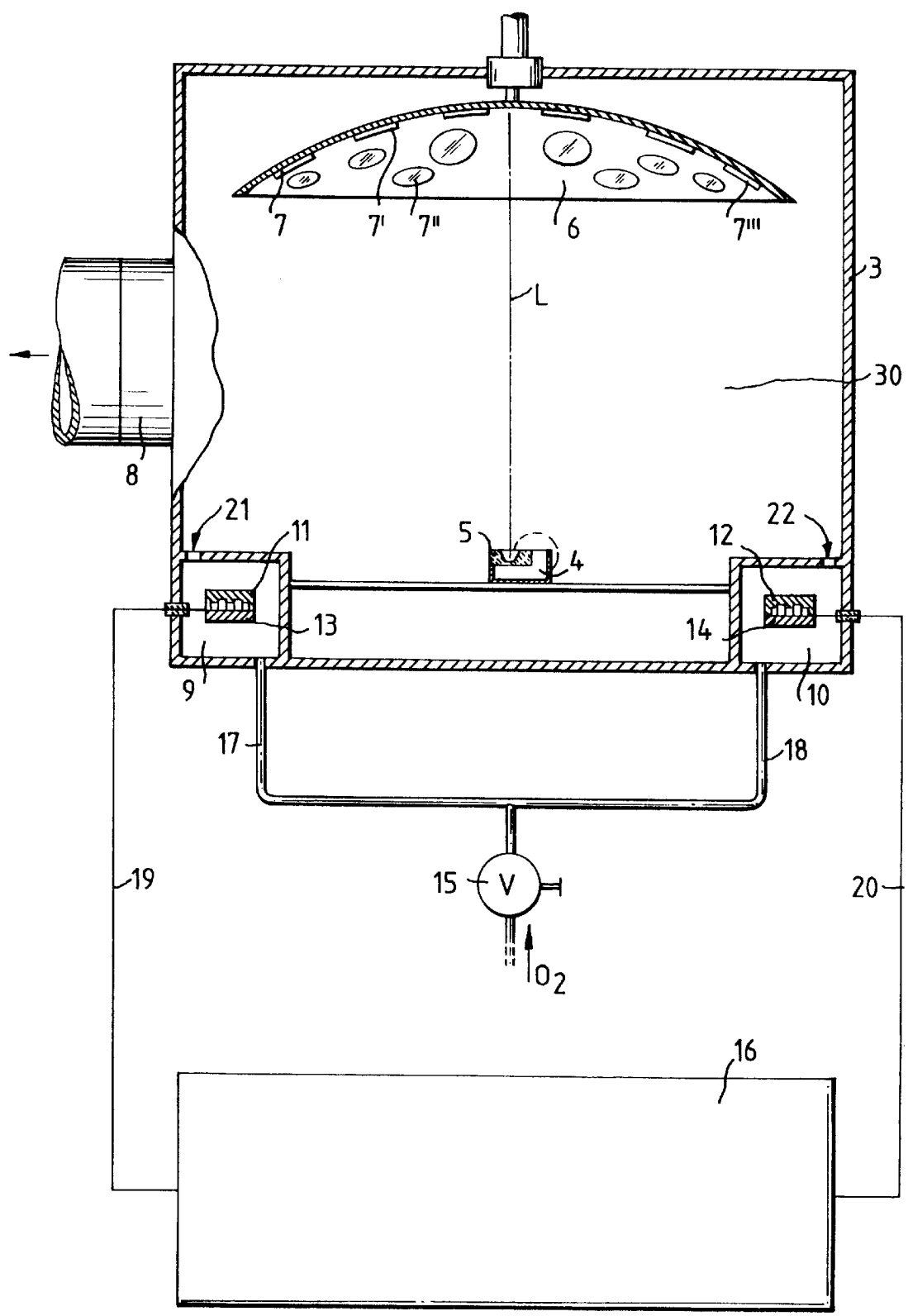
FIG. 1 is a schematic cross section of a first embodiment of the coating apparatus.

FIG. 1 shows a vacuum apparatus consisting of a vacuum chamber 3 and a crucible 5, working together with an electron beam source 4; a substrate holder 6, mounted above crucible 5, carrying substrates 7; a connection 8 for a vacuum pump; two compartments 9, 10 in which sputtering cathodes 11, 12 are installed, the targets 13, 14 of which face the side walls directed away from substrate carrier 6; a process gas source 15, which is connected by way of gas lines 17, 18 to compartments 9, 10; and a medium-frequency power supply 16, which is connected by way of power lines 19, 20 to cathodes 13, 14.

Cathodes 13, 14 are installed in compartments 9, 10, which are separated from vacuum chamber 3. The sputtering direction of the two magnetron cathodes 11, 12 is selected in such a way that the sputtered-off particles spread out in directions proceeding away from substrates 7. Compartments 9, 10 are designed so that the particles which are separated by the magnetron cathodes are collected in the compartments.

Depending on the desired pressure difference between compartments 9, 10 and process space 30, vacuum chamber 3 and the individual compartments 9, 10 can be connected by way of a gap 21, 22 as a pressure stage. The cathodes in their compartments are supplied through gas inlets with the working gas, typically argon and oxygen. The pressure in the compartments is selected so that the plasma discharge burns in a stable manner.

Each magnetron 11, 12 carries a target 13, 14, which is sputtered, even though this is not desirable in the present case. For this reason, a target material is chosen which has a low sputtering rate and/or yields sputtering products which do not interfere with the vapor deposition process. In the case of oxygen-containing atmospheres, graphite is a suitable target material. The carbon burns during the sputtering process, and the $CO_2$ is pumped off.

The two cathodes 11, 12 are connected to an a.c. power source 16. An embodiment of this power supply is described in DE 41 38 793.

The embodiment according to FIG. 2 differs from that according to FIG. 1 essentially in that compartments 23, 24 are on the same plane as the substrates 7 where targets 13, 14 of cathodes 11, 12 are facing upper wall sections 25, 26 of compartments 23, 24, and where the gaps or channels 27, 28 open out into the process chamber at or near lower edge 29 of umbrella-like substrate holder 6.

The apparatuses according to FIGS. 1 and 2 have the advantage that cold cathodes 11, 12 supply a wide plasma band for ion assistance, especially in cases where coatings of $SiO_2$ are being produced on, for example, eyeglass lenses. The previously known APS (advanced plasma source) (DE-OS 38 32 693, DE-OS 38 20 478) for ion-assisted electron beam evaporation works with hot cathodes, which have the disadvantage of being sensitive to "poisoning"; that is, the APS no longer offers the required emission current after it has been exposed to harmful gases or too much oxygen. In addition, a hot cathode suffers from relatively rapid wear and must be replaced at frequent intervals. Hot cathodes are also eroded by the bombardment with ions, with the result that the vapor-deposited layer is contaminated with cathode material. Finally, the choice of the cathode material is limited, because a material is required which provides a sufficiently high electron emission rate in the vapor deposition atmosphere (e.g., $LaB_6$ is used). Finally, the APS is a point source, which must always be set up a considerable distance away from the substrates to ensure that a sufficiently uniform ion distribution is achieved.

We claim:

1. Vacuum coating apparatus comprising
   a vacuum chamber,
   a crucible in said vacuum chamber for holding a material to be evaporated,
   an electron beam source for evaporating material in said crucible,
   a substrate holder in said vacuum chamber for holding a plurality of substrates to be coated by evaporated material from said crucible, said holder and said crucible being separated by a process space,
   a pair of compartments in said vacuum chamber on opposite sides of said process space, each compartment having an aperture communicating with said process space,
   a magnetron cathode in each said compartment,
   an RF power supply connected to said cathodes, and
   means for supplying process gas to each of said compartments.

2. Apparatus as in claim 1 wherein said compartments are located below said substrate holders, said apertures opening on a level with said crucible.

3. Apparatus as in claim 1 wherein said compartments are located above said crucible, said apertures opening on a level with said substrate holder.

4. Apparatus as in claim 1 wherein each magnetron cathode comprises a target, each target facing away from the aperture of the compartment in which said target is located.

5. Apparatus as in claim 1 wherein said substrate holder has a downwardly facing concave surface with a center located directly above said crucible.

* * * * *